(12) United States Patent
Mak et al.

(10) Patent No.: US 6,222,246 B1
(45) Date of Patent: *Apr. 24, 2001

(54) FLIP-CHIP HAVING AN ON-CHIP DECOUPLING CAPACITOR

(75) Inventors: Tak M. Mak, Union City; Paul Winer, Santa Clara; Valluri R. Rao, Saratoga; Richard H. Livengood, Los Gatos, all of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/227,594

(22) Filed: Jan. 8, 1999

(51) Int. Cl.[7] .............................. H05K 7/02; H05K 1/16; H01K 23/48
(52) U.S. Cl. .......................... 257/532; 257/700; 257/723; 257/724; 257/737; 257/738; 257/777; 257/778; 257/784; 361/783; 361/767; 361/768; 361/792; 174/255; 174/256; 438/125
(58) Field of Search .................................. 257/532, 784, 257/691, 782, 670, 70.2, 723, 773, 730, 686, 685, 467, 777, 738, 778, 737; 321/783, 768, 767, 792; 174/255, 256; 438/125

(56) References Cited

U.S. PATENT DOCUMENTS

| | | | |
|---|---|---|---|
| 4,811,082 | * | 3/1989 | Jacobs et al. ................. 174/68.5 |
| 5,239,198 | * | 8/1993 | Lin et al. ...................... 257/693 |
| 5,528,209 | * | 6/1996 | Macdonald et al. ............ 257/691 |
| 5,600,257 | * | 2/1997 | Leas et al. ..................... 324/754 |
| 5,608,261 | * | 3/1997 | Bhattacharyya et al. ....... 257/770 |
| 5,629,383 | * | 5/1997 | Knight et al. .................. 361/782 |
| 5,702,984 | * | 12/1997 | Bertin et al. ................... 257/777 |
| 5,764,070 | * | 6/1998 | Pedder ........................... 324/754 |
| 5,772,451 | * | 6/1998 | Dozier, II et al. ............... 439/70 |
| 5,811,868 | * | 9/1998 | Bertin et al. ................... 257/532 |
| 5,870,289 | * | 2/1999 | Tokuda et al. .................. 361/779 |
| 5,903,050 | * | 5/1999 | Thurairajaratnam et al. ... 257/691 |
| 5,926,359 | * | 7/1999 | Greco et al. ................... 257/296 |
| 5,974,662 | * | 11/1999 | Eldridge et al. ................. 29/842 |
| 5,977,640 | * | 11/1999 | Bertin et al. ................... 257/777 |
| 6,027,980 | * | 2/2000 | Gardner ......................... 438/396 |
| 6,075,712 | * | 6/2000 | McMahon ....................... 361/783 |

FOREIGN PATENT DOCUMENTS 7-184178 7/1995 (JP).

* cited by examiner

Primary Examiner—Alexander O. Williams
(74) Attorney, Agent, or Firm—Blakely, Sokoloff, Taylor & Zafman LLP

(57) ABSTRACT

A flip-chip having a decoupling capacitor electrically coupled to the backside thereof. The flip-chip includes a semiconductor substrate having first and second opposing surfaces with circuit elements formed within the first surface. A plurality of raised bump contacts are located on the first surface and connected to the circuit elements. A plurality of electrical interconnects are also located on or within the second surface and connected to the circuit elements. The electrodes of a decoupling capacitor are electrically coupled to the plurality of electrical interconnects.

17 Claims, 2 Drawing Sheets

FLIP-CHIP HAVING AN ON-CHIP DECOUPLING CAPACITOR

BACKGROUND OF THE INVENTION

1. Field of the Invention

The present invention relates generally to integrated circuit devices and, more specifically, to a flip-chip having an on-chip decoupling capacitor.

2. Description of Related Art

It is generally desirable to have a semiconductor package which is more efficient and has high decoupling capacitance/low inductance. It is known that the effective inductance can be lowered by connecting decoupling capacitors nearer to a circuit (i.e, the effective inductance is lower by reducing the lead length). Inductance is a function of path length, therefore the longer the current path, the higher the inductance. High inductance, which yields higher supply noise in semiconductor packages, reduces the performance of integrated circuits (ICs). Also, inductance between an IC and power supply can induce spurious voltage spikes in the power supply system, which can in turn cause timing problems in signal switching.

Decoupling capacitors are housed on semiconductor packages in order to lower the inductance through the package by reducing the lead length. Decoupling capacitors placed close to power consuming circuits are able to smooth out voltage variation with a stored charge on the decoupling capacitor. The stored charge either dissipates or is used as a local power supply to device inputs during signal switching stages, allowing the decoupling capacitor to negate the effects of voltage noise induced into the system by parasitic inductance. Off-chip decoupling capacitors, however, are not sufficient for very high speed microprocessor applications. Since the decoupling capacitors are located at a relatively long distance from the switching circuits, the time delay caused by the long inductance path makes the off-chip capacitors unusable with gigahertz switching circuits.

In order to sustain high frequency circuit operation, an ample amount of capacitive decoupling must be provided close to the switching circuits. Although it is possible to integrate chip capacitors within the chip's circuit elements, the capacitors compete for valuable die area that could be used for building additional circuits. Due to the limited area in which to build these capacitors, the overall capacitive decoupling that they provide is also limited.

SUMMARY OF THE INVENTION

A flip-chip package device having a decoupling capacitor electrically coupled to or through the backside of the chip is disclosed. The flip-chip package device includes a semiconductor substrate having first and second opposing surfaces with circuit elements formed within the first surface. A plurality of raised bump contacts are located on the first surface and connected to the circuit elements. A plurality of electrical interconnects are also located on or within the second surface and are connected to the circuit elements. The electrodes of a decoupling capacitor are electrically coupled to one or more of the plurality of electrical interconnects.

BRIEF DESCRIPTION OF DRAWINGS

The invention is further described by way of example with reference to the accompanying drawings, wherein.

DETAILED DESCRIPTION OF THE INVENTION

A controlled collapse chip connection (C4) packaged chip (or flip-chip) having a decoupling capacitor electrically coupled to or through the backside of the chip is described. In the following description, numerous specific details are set forth such as material types, processes, etc., in order to provide a thorough understanding of the present invention. However, it will be obvious to one of skill in the art that the invention may be practiced without these specific details. In other instances, well-known elements and processing techniques have not been shown in particular detail in order to avoid unnecessarily obscuring the present invention.

Figure 1:
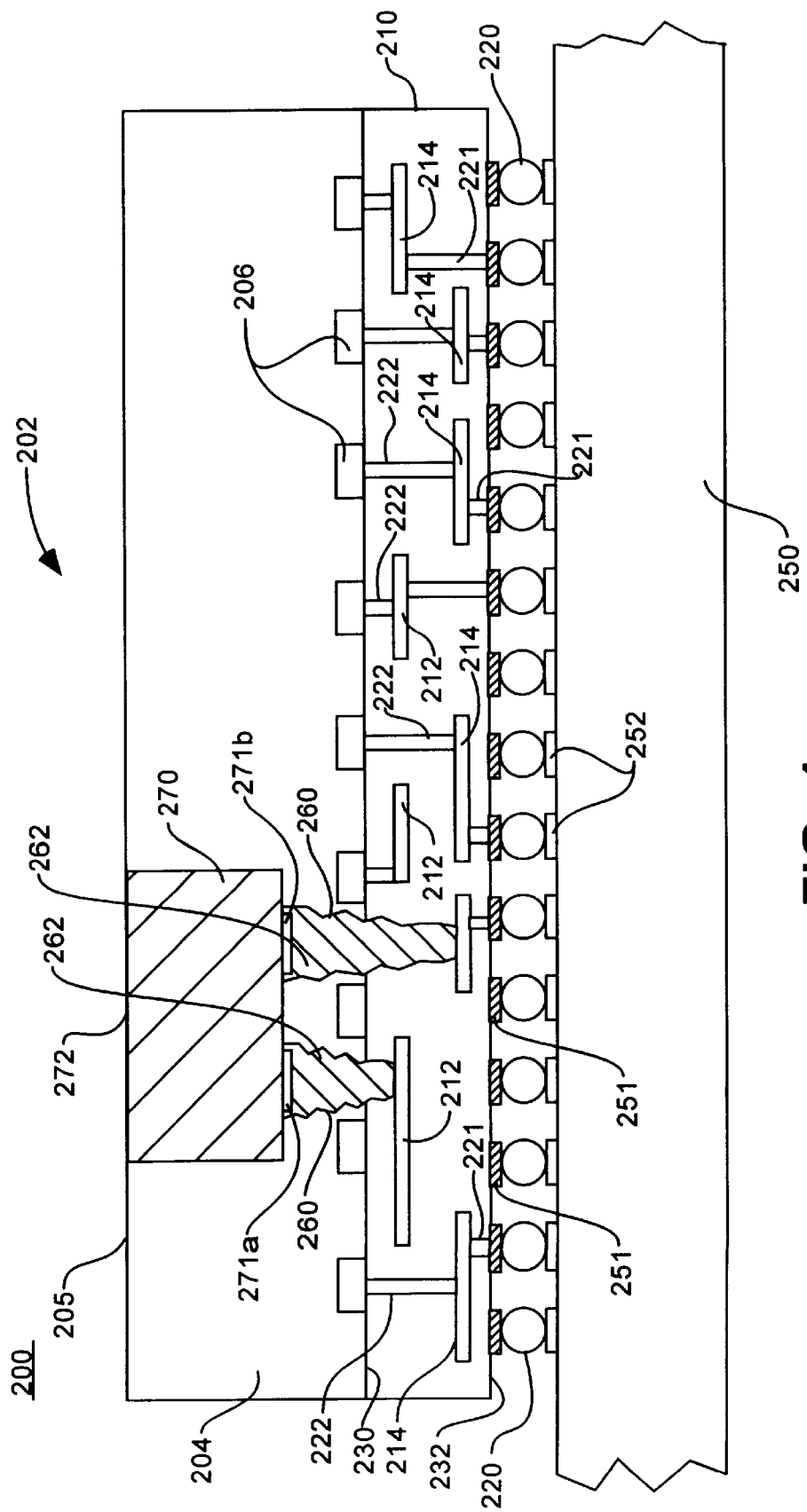
FIG. 1 is a sectioned side view of a flip-chip with a decoupling capacitor electrically coupled to the backside of the chip; and, FIG. 2 is a sectioned side view of a flip-chip in another embodiment of the present invention.

FIG. 1 illustrates a side view of a chip package 200 in one embodiment of the present invention. Package 200 includes a semiconductor chip 202 that is electrically coupled to a package substrate 250 via a plurality of raised bump/solder bump connections 220. Chip 202 includes a semiconductor substrate 204 having a plurality of circuit elements 206 formed within the frontside surface 230 of the semiconductor substrate 204. A routing (or conductive) region 210 is located above the frontside surface 230 of semiconductor substrate 204. Routing region 210 generally includes multiple layers of conductive lines 212 and 214 that are electrically coupled to the circuit elements 206 by conductive vias 222.

The conductive lines 212 and 214 of routing region 210 may be any one of or combination of several conductive materials such as cobalt, molybdenum, tungsten, titanium, aluminum, copper, doped silicon, doped polysilicon, or a metal silicide layer. Conductive lines 212 and 214 are typically deposited on and separated by dielectric layers. Although only two conductive layers are shown in FIG. 1, it is noted that conductive region 210 generally includes additional conductive layers. For the purpose of this discussion, conductive lines 212 typically comprise the metal one (M1) layer of the chip and conductive lines 214 comprise the metal two (M2) layer of the chip. Conductive layers such as M1 and M2 are often used to distribute, for example, power and ground to transistors. Note, however, that M1 and M2 are not of any specific order and may, respectively, be MX and MY, where MX represents a power grid structure and MY represents a ground plane or ground grid structure. Conductive region 210 also includes additional layers of signal lines, which are not shown in FIG. 1. External power and ground connections to the chip 202 are made through a first set of electrical contact pads 251 located on the top-side surface 232 of conductive region 210. Contact pads 251 are electrically coupled to conductive lines 212 and 214 by conductive vias 221.

A decoupling capacitor 270 having electrodes 271a and 271b is embedded within the backside surface 205 of chip 202. Preferably, the backside surface 272 of capacitor 270 is flush with the backside surface 205 of chip 202. This configuration maximizes the surface area available for attaching a heatsink or other heat dissipating device to the backside of chip 202.

The electrodes 271a and 271b of capacitor 270 are electrically coupled to conductive lines 212 and 214, respectively. Electrically conductive vias 260 couple the capacitor electrodes 271a and 271b to conductive lines 212 and 214. By electrically coupling the decoupling capacitor 270 to the power and ground planes through the backside of chip 202, the inductance path length between the capacitor electrodes 271a and 271b and the switching circuit elements 206 is kept to a minimum. As a result, the inductance induced time delay is also kept to a minimum. In certain situations, the capacitor 270 may be electrically coupled directly to the circuit elements 206. The direct connection allows the capacitor to supply the charge to critical circuit elements without the need to go through the power and ground grid, allowing the capacitor to function as a local reservoir and further reducing the inductive path and the inductance induced time delay. The short time delay associated with the backside decoupling capacitor 270 enhances the capacitor's ability to respond to voltage spikes. More particularly, the placement of capacitor 270 on or within the backside 205 of chip 202 enables the capacitor to respond to voltage spikes in very high speed switching circuits, such as gigahertz switching circuits.

With continuing reference to FIG. 1, semiconductor substrate 204 is typically made of silicon. Vias 260 are produced by etching or micromachining the backside 205 of substrate 204 and vapor depositing a conductive material within the via. The conductive material generally includes a conductive metal such as aluminum or copper. Other electrically conductive metals or materials may also be used.

In the embodiment of FIG. 1, capacitor 270 is located within a recess formed within the backside of chip substrate 204. In an alternative embodiment, capacitor 270 is attached to the backside surface 205 of chip 202. In such an embodiment, conductive vias 260 extend through the entire thickness of the substrate 204 to electrically couple electrodes 271a and 271b to power and ground planes 212 and 214, respectively.

Figure 2:
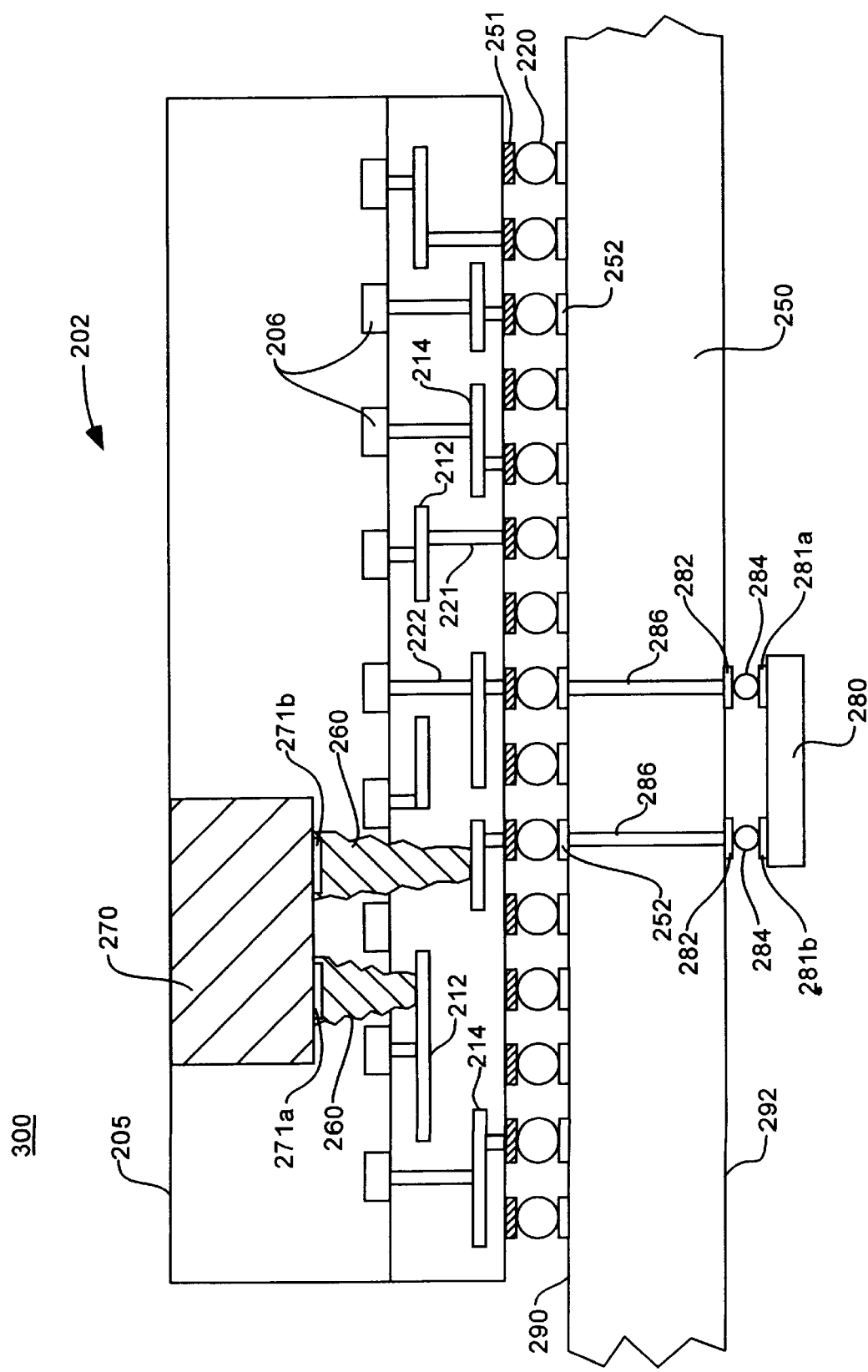

With reference to FIG. 2, a chip package 300 of another embodiment of the present invention is shown. Chip package 300 includes a flip-chip 202 having a decoupling capacitor 270 located within a recess in the backside 205 as shown in FIG. 1. Chip package 300 includes an additional decoupling capacitor 280 which is located on the bottom surface 292 of the package substrate 250. Lands 252 located on the top surface 290 of substrate 250 are electrically coupled to lands 282 located on the bottom surface 292 of substrate 250 by conductive vias 286. The capacitor electrodes 281a and 281b are coupled to lands 282 by solder bump connections 284. Other connecting structures, such as gold bump connections, may be used to couple the capacitor electrodes 281a and 281b to lands 282. As shown in FIG. 2, electrodes 281a and 281b are electrically coupled to the ground plane 214 of chip 202. Note that electrodes 281a and 281b may each be electrically coupled to the power plane 212 and/or the ground plane 214. The placement of capacitor 280 on the bottom surface 292 of package substrate 250 greatly reduces the current path between the electrodes 281a and 281b and the power and ground planes of chip 202 as compared to conventional off-chip decoupling capacitors.

Vias 286 are produced by micromachining through holes in package substrate 250 and depositing a conductive material within the via. The conductive material generally includes copper. Other electrically conductive metals or materials may also be used.

In an alternative embodiment, the electrodes 281a and 281b of capacitor 280 are coupled to lands 252 located on the top surface 290 of package substrate 250 through a series of conductive layers and conductive vias located within the package substrate.

Whereas many alterations and modifications of the invention will no doubt be appreciated by one of ordinary skill in the art after having read the foregoing description, it is understood that the particular embodiments shown and described by way of illustration are in no way intended to be considered limiting. Therefore, references to details of the individual embodiments are not intended to limit the scope of the claims which in themselves recite only those features regarded as essential to the invention.

We claim:

1. An integrated circuit device comprising:
    a semiconductor substrate;
    a plurality of electrical interconnects coupled to said circuit elements; and
    a first decoupling capacitor disposed on a backside of said semiconductor substrate.

2. The integrated circuit device of claim 1 further comprising circuit elements, a first layer of conductive lines, and a second layer of conductive lines, said first layer of conductive lines and said second layer of conductive lines electrically connecting said circuit elements, said first layer of conductive lines located adjacent said circuit elements; at least one of said plurality of electrical interconnects coupled to at least one of said first layer of conductive lines.

3. The integrated circuit device of claim 1 further comprising circuit elements, power metal lines, and ground metal lines connected to said circuit elements, said first decoupling capacitor being coupled to at least one of said power lines and at least one of said ground lines.

4. The integrated circuit device of claim 1 wherein said first decoupling capacitor is located within a recess of said backside, said first decoupling capacitor and said semiconductor substrate each having a backside surface, with said backside surfaces being substantially co-planar.

5. The integrated circuit device of claim 1 attached to a package substrate having a top surface and an opposite bottom surface, said raised bump contacts of said integrated circuit being connected to lands on said top surface of said package substrate; wherein said package substrate has at least one first decoupling attached to said bottom surface, and is electric coupled to said lands on said top surface of said package substrate.

6. An integrated circuit device comprising:
    a semiconductor substrate;
    a first recess in said semiconductor substrate;
    circuit elements formed within said semiconductor substrate;
    conductive lines electrically coupling said circuit elements, said conductive lines comprising power and ground metal lines;
    a plurality of bump contacts disposed on said semiconductor substrate and coupled to said circuit elements;
    a plurality of electrical interconnects linked to said recess and coupled to said power and ground metal lines; and
    a first decoupling capacitor disposed in said first recess and electrically coupled to said plurality of electrical interconnects, said first decoupling capacitor and said semiconductor substrate each having a backside surface, with said backside surfaces being substantially co-planar.

7. An assembly comprising:
    an integrated circuit device including a semiconductor substrate, circuit elements formed within said semiconductor substrate, a plurality of raised bump contacts disposed on said semiconductor substrate and coupled to said circuit elements, a plurality of electrical interconnects disposed on said semiconductor substrate and coupled to said circuit elements, and a first decoupling capacitor electrically coupled to said plurality of electrical interconnects; and a package substrate, said bump contacts of said integrated circuit being coupled to lands on said package substrate, said package substrate having at least one second decoupling capacitor, said second decoupling capacitor electrically coupled to said lands.

8. The assembly of claim 7 wherein said integrated circuit device further comprises a first layer of conductive lines and a second layer of conductive lines electrically coupled to said circuit elements, said first layer of conductive lines located adjacent said circuit elements, at least one of said electrical interconnects coupled to at least one of said first layer conductive lines.

9. The assembly of claim 7 wherein said integrated circuit device further comprises power metal lines and ground metal lines coupled to said circuit elements, said first decoupling capacitor coupled to at least one of said power metal lines and at least one of said ground metal lines.

10. The assembly of claim 7 wherein said integrated circuit device further comprises said first decoupling capacitor located within a recess in said semiconductor substrate, said first decoupling capacitor and said semiconductor substrate each having a backside surface, with said backside surfaces being substantially co-planar.

11. An integrated circuit device comprising:

a semiconductor substrate;

circuit elements formed within said semiconductor substrate; and a decoupling capacitor directly coupled to at least one of said circuit elements.

12. The integrated circuit device of claim 11 wherein said first decoupling capacitor is located within a recess in said semiconductor substrate, said first decoupling capacitor and said semiconductor substrate each having backside surfaces, with each said backside surface being substantially co-planar.

13. The integrated circuit device of claim 1 wherein said second decoupling capacitor is electrically coupled to at least one of said plurality of electrical interconnects.

14. The integrated circuit device of claim 13 further comprising power metal lines and ground metal lines connected to said circuit elements, said second decoupling capacitor electrically coupled to at least one of said plurality of electrical interconnects.

15. The integrated circuit device of claim 13 wherein said second decoupling capacitor is located within a recess in said semiconductor substrate, said second decoupling capacitor and said semiconductor substrate each having a backside surface, with said backside surfaces being substantially co-planar.

16. The integrated circuit device of claim 6 further comprising a second decoupling capacitor disposed in a second recess in said second surface, said second decoupling capacitor and said semiconductor substrate each having a backside surface, with said backside surfaces being substantially co-planar.

17. The integrated circuit device of claim 4 further comprising a heat dissipating device attached to at least one of said backside surfaces.

* * * * *